United States Patent
Huang et al.

(10) Patent No.: US 6,835,653 B1
(45) Date of Patent: Dec. 28, 2004

(54) METHOD OF FORMING ADJACENT HOLES ON A SEMICONDUCTOR SUBSTRATE

(75) Inventors: Tse-Yao Huang, Taipei (TW); Yi-Nan Chen, Taipei (TW)

(73) Assignee: Nanya Technology Corp., Tao-Yuan Hsien (TW)

(*) Notice: Subject to any disclaimer, the term of this patent is extended or adjusted under 35 U.S.C. 154(b) by 0 days.

(21) Appl. No.: 10/605,213

(22) Filed: Sep. 16, 2003

(51) Int. Cl.⁷ .......................................... H01L 21/4763
(52) U.S. Cl. ...................... 438/637; 438/638; 438/639
(58) Field of Search ................................ 438/637, 638, 438/639, FOR 355, FOR 489

(56) References Cited

U.S. PATENT DOCUMENTS

| | | | | |
|---|---|---|---|---|
| 4,832,789 A | * | 5/1989 | Cochran et al. | 438/624 |
| 5,874,359 A | * | 2/1999 | Liaw et al. | 438/640 |
| 6,337,267 B1 | * | 1/2002 | Yang | 438/618 |
| 6,458,692 B1 | * | 10/2002 | Kim | 438/639 |
| 6,638,805 B2 | * | 10/2003 | Park et al. | 438/233 |
| 6,713,386 B1 | * | 3/2004 | Hu et al. | 438/639 |
| 2002/0155693 A1 | * | 10/2002 | Hong et al. | 438/618 |

* cited by examiner

*Primary Examiner*—George Fourson
*Assistant Examiner*—Michelle Estrada
(74) *Attorney, Agent, or Firm*—Winston Hsu

(57) ABSTRACT

A method of forming adjacent holes on a semiconductor substrate. The adjacent holes are separated by a fine line structure. The method includes the steps of providing a semiconductor substrate with an insulating layer on the substrate, forming a step-shaped structure, with a first horizontal surface, a second horizontal surface, and a vertical surface, on the surface of the insulating layer, depositing a sacrificial layer with an average thickness, forming a patterned photoresist layer on portions of the first and second horizontal surface, performing an etch-back process to remove the sacrificial layer not covered by the photoresist layer and forming a spacer on the vertical surface, removing the patterned photoresist layer, and using the spacer and the remaining sacrificial layer as a hard mask to remove the insulating layer, thereby forming two adjacent holes.

11 Claims, 12 Drawing Sheets

METHOD OF FORMING ADJACENT HOLES ON A SEMICONDUCTOR SUBSTRATE

BACKGROUND OF INVENTION

1. Field of the Invention

The invention relates to a method of forming a plurality of holes on a semiconductor substrate, and more particularly, to a method of forming two adjacent holes with a fine line structure between the adjacent holes on a semiconductor substrate.

2. Description of the Prior Art

With the development of modern technology, semiconductor products have applied more widely in each field of life, especially in the fields of communication and electric products. Since high technology products have been pushed for size reductions, integrations of semiconductor products have to be raised. Therefore each unit area of the substrate comprises more semiconductor elements, and the spacing between the semiconductor elements becomes smaller and smaller. However, there are many problems resulting from the high integration requirement. For example, more than one photomask and photo-etch-process (PEP) are needed to perform complicated processes to define the pattern of an original circuit design when fabricating metal lines with a small width or holes with a small size. Forming opening structures, such as contact holes, is a basic process of fabricating semiconductor products. In order to match the high-integration requirement, an original circuit design may comprise two adjacent holes that are too close to be fabricated on the substrate so as to produce failed pattern or to cause material damaged.

Please refer to FIGS. 1–3. FIGS. 1–3 are schematic diagrams of a fabrication process of forming two adjacent holes on a semiconductor substrate 10 according to the prior art. The semiconductor substrate 10 comprises a plurality of gates 12, 14, 16, 18, a passivation layer 24, a borophosphosilicate glass (BPSG) layer 20 serving as an insulating layer, and an undoped silicate glass (USG) layer 22. At first, a photoresist layer (not shown) is formed on the USG layer. Then a PEP is performed to remove portions of the photoresist layer at locations where the two adjacent holes are predetermined formed so as to form a patterned photoresist layer 26. Referring to FIG. 2, an anisotropic etching process, such as a dry-etching process, is performed to remove portions of the USG layer 22 and the BPSG layer 20 not covered by the patterned photoresist layer 26 to expose the passivation layer 24 so as to form two adjacent holes 28, 30. Finally, as shown in FIG. 3, the patterned photoresist layer 26 is removed.

Since the holes 28 and 30 are very close, there is a fine line structure 32 with a very small width formed by the USG layer 22 and the BPSG layer 20 between the holes 28 and 30. For example, the width of the fine line structure 32 may be smaller than 100 angstroms (Å). In this condition, if only one photomask is used to transfer the original circuit design to the photoresist layer, it is hard to define the pattern of the fine line structure 32 accurately on the photoresist layer to form an ideal patterned photoresist layer 26. In contrast, after the photolithography process, the pattern of the fine line structure 32 may be transferred on a shifting location or to have a changed width, and even more the fine line structure 32 may disappear. Those defects seriously affect following processes and the yield of products. For example, if the fine line structure 32 has to be formed between the gates 14 and 16 according to the original circuit design, the following formed materials, such as a conductive material, doped polysilicon, on the fine line structure 32 will shift together when the patterned photoresist layer 26 can not define the fine line structure 32 in a correct location, which results in a disorder of circuits on the semiconductor substrate, such as short or failed electrical connection. Furthermore, the photoresist layer for transferring the photomask pattern needs to have a greater thickness in the prior art. As a result, a higher aspect ratio of the photoresist layer 26 appears after the PEP. Thus the photoresist layer 26 easily collapses during another fabricating process to cause serious problems.

Please refer to FIGS. 4–5. FIGS. 4–5 are schematic diagrams of the fabrication of forming adjacent holes by using a hard mask according to the prior art. The semiconductor substrate 50 comprises a plurality of gates 52, 54, 56, 58, a passivation layer 60 covering the gates 52, 54, 56, 58, a BPSG layer 62, and a USG layer 64. As shown in FIG. 4, a hard mask 66 formed by silicon nitride is deposited on the USG layer 64, and a photoresist layer 68 is deposited on the hard mask 66. A photolithography process is then performed to transfer the photomask pattern to the photoresist layer and form a patterned photoresist layer 68. As shown in FIG. 5, an etching process is performed to remove the hard mask 66 not covered by the patterned photoresist layer 68 so that the remaining hard mask 66 has a pattern the same as the patterned photoresist layer 68. And then the patterned photoresist layer 68 is removed. An etching process is next performed to remove the USG layer 64 and the BPSG layer 62 not covered by the hard mask 66 to expose portions of the surface of the passivation layer 60. Finally, the hard mask 66 is removed or remained according to process design to form the two adjacent holes 70 and 72 and the fine line structure 74.

In this prior art, although a patterned photoresist layer with high aspect ratio is not needed during the etching process of the USG layer 64 and the BPSG layer 62, the problem of inaccurately transferring the pattern of the fine line structure 74 still exists because the fine line structure 74 has a very small width, which reduces the yield of the semiconductor products.

SUMMARY OF INVENTION

It is therefore a primary objective of the claimed invention to provide a method for forming adjacent holes by transferring patterns accurately so as to solve the above-mentioned problem.

According to the claimed invention, a method for forming two adjacent holes on a semiconductor substrate is disclosed, wherein the two adjacent holes are a first hole and a second hole separated by a fine line structure. The method comprises providing a semiconductor substrate with an insulating layer on its surface and forming a step-shaped structure on the surface of the insulating layer, wherein the step-shaped structure includes a first horizontal surface, a second horizontal surface, and a vertical surface between the first and the second horizontal surfaces. The method further comprises depositing a sacrificial layer with an average thickness on the insulating layer to cover the first horizontal surface, the second horizontal surface, and the vertical surface, forming a patterned photoresist layer covering portions of the first and the second horizontal surface, performing an etch-back process to remove a portion of the sacrificial layer that is on the first and the second horizontal surface and not covered by the patterned photoresist layer to form a spacer on the vertical surface, removing the patterned photoresist layer, and finally taking the spacer and the remaining sacrificial layer as a hard mask to etch the insulating layer not covered by the hard mask so as to form the adjacent first hole and second hole.

It is an advantage of the claimed invention that the method uses two photolithography processes (with two patterned photoresist layers) and a sacrificial layer serving as a hard mask for transferring the original circuit design and photomask pattern, so that the photomask pattern can be transferred more accurately and the transformation failure from exceeding an exposure limit in the prior art can be avoided. According to the claimed invention, after the second etching process is performed, a well-known technology can be used to adjust a bottom width of the spacer on the surface of the vertical surface when the sacrificial layer is etched back so as to gain a very small dimension of the fine line structure to match the original circuit design. In addition, the etch-back process of the insulating layer can be performed perfectly with a well-known skill of adjusting an etch selectivity when the spacer is taken as the hard mask for protecting the insulating layer. Therefore, the original circuit design can be transferred to the semiconductor substrate accurately to form very adjacent holes.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
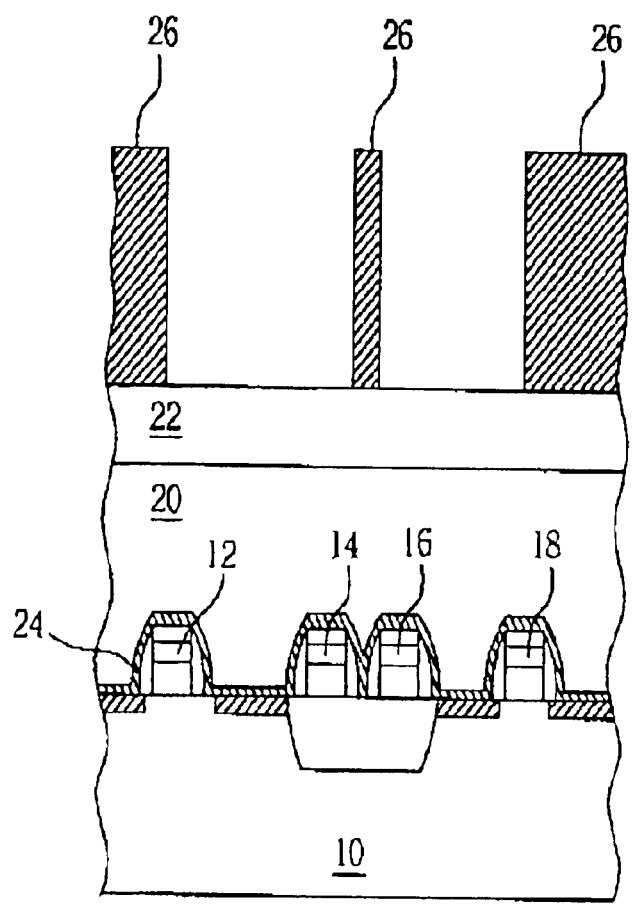
FIGS. 1–3 are schematic diagrams of a fabrication of forming two adjacent holes on a semiconductor substrate according to the prior art.
Figure 2:
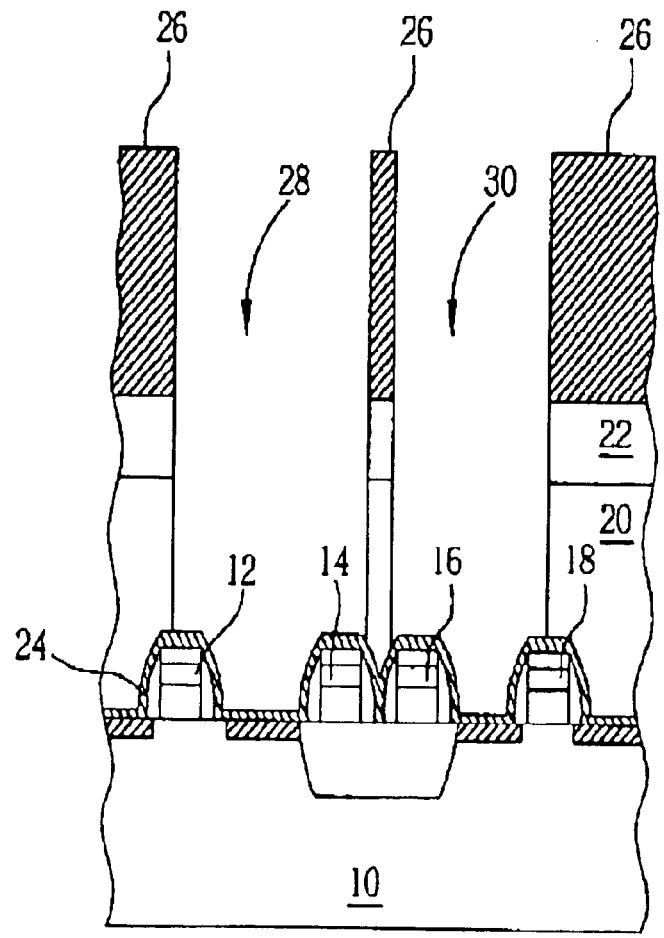
Figure 3:
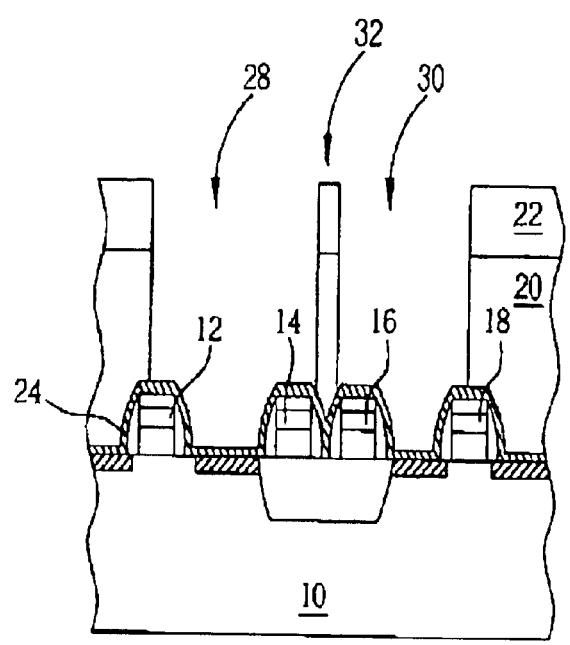
Figure 4:
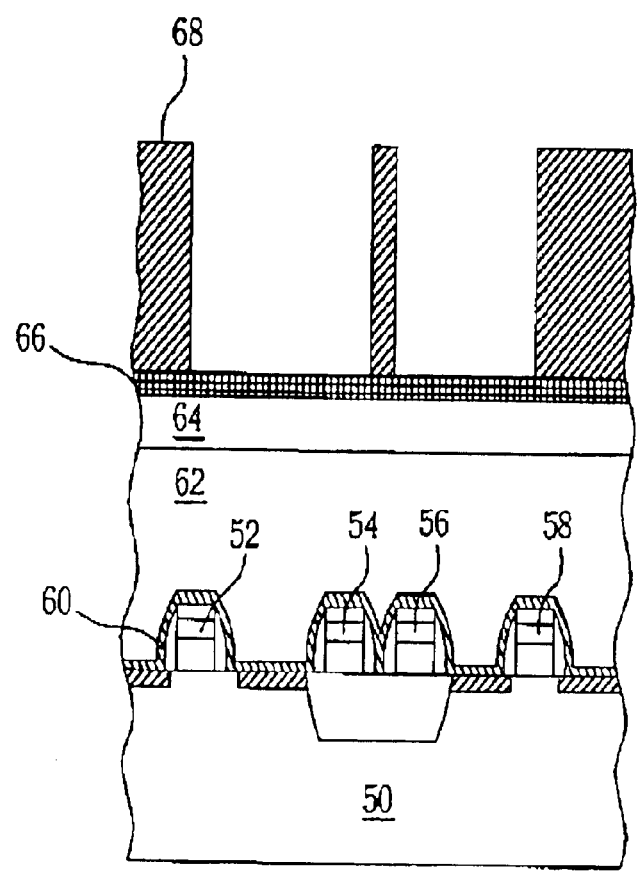
FIGS. 4–5 are schematic diagrams of a fabrication of forming adjacent holes by using a hard mask according to the prior art.
Figure 5:
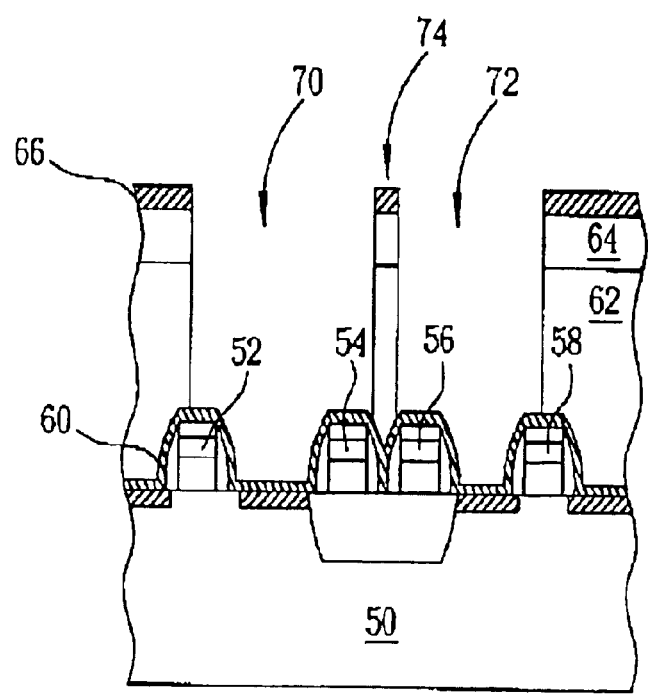
Figure 6:
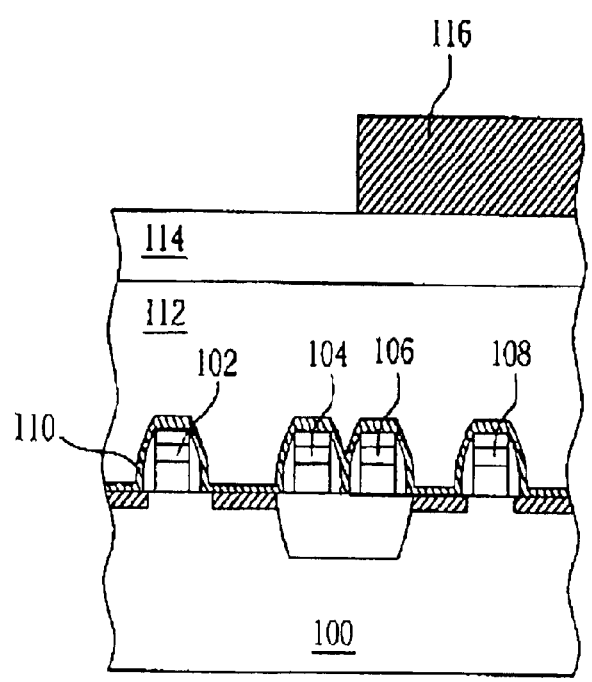
FIGS. 6–12 are schematic diagrams of the fabrication of forming two adjacent holes on a semiconductor substrate according to the present invention.

Please refer to FIGS. 6–12. FIGS. 6–12 are schematic diagrams of the fabrication of forming two adjacent holes 130, 132 on a semiconductor substrate 100 according to the present invention. The semiconductor substrate 100 comprises a plurality of gates 102, 104, 106, and 108, a passivation layer 110, a BPSG layer 112, and a USG layer 114 covering the gates. The BPSG layer 112 and the USG layer 114 serve as insulating layers of the semiconductor substrate 100. Each of the gates 102, 104, 106, 108 comprises a gate oxide layer, a conductive layer, an insulating layer, a spacer, a drain, and a source. A photoresist layer (not shown) is first formed on the USG layer 114, and then a photolithography process is performed to transfer a photomask pattern of a photomask to the photoresist layer so as to form a patterned photoresist layer 116. It should be noticed that the patterned photoresist layer 116 has a different pattern from the original circuit design, which does not define the pattern of the adjacent holes 130 and 132. As shown in FIG. 6, the patterned photoresist layer 116 defines a boundary of the hole 130 closing to the hole 132. On the other hand, the patterned photoresist layer 116 does not define boundaries of the hole 132 and the boundary of the hole 130 opposite to the hole 132.

Figure 7:
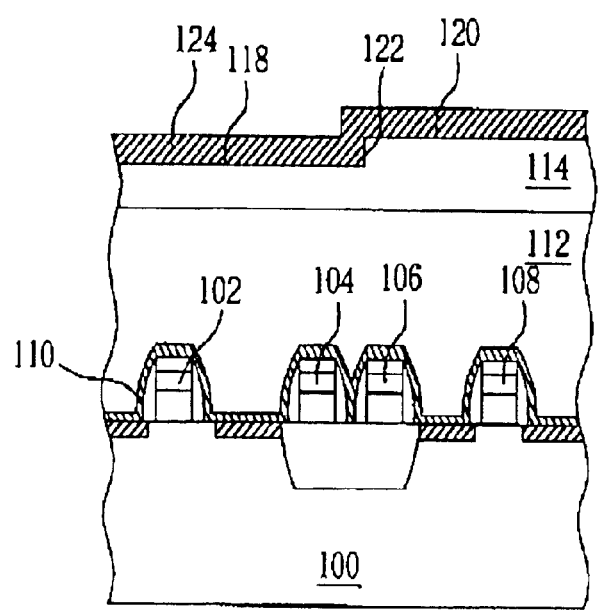

Referring to FIG. 7, an etching process is performed to remove a portion of the USG layer 114 not covered by the patterned photoresist layer 116, so that a step-shaped structure is formed on the surface of the USG layer 114. The step-shaped structure includes a first horizontal surface 118, a second horizontal surface 120 higher than the first horizontal surface 118, and a vertical surface 122 between the first and second horizontal surfaces, wherein a step height difference is formed between the first horizontal surface 118 and the second horizontal surface 120. Then a sacrificial layer 124 with an average thickness is deposited on the first horizontal surface 118, the second horizontal surface 120, and the vertical surface 122. In a preferable embodiment, the thickness of the sacrificial layer 124 is approximately equal to the step height difference between the first and the second horizontal surfaces 116, 118. This means the surface of the sacrificial layer 124 covering the first horizontal surface 118 and the surface of the second horizontal surface 120 are in a same plane. The sacrificial layer 124 can be formed by silicon nitride for being a liner silicon nitride in following processes.

Figure 8:
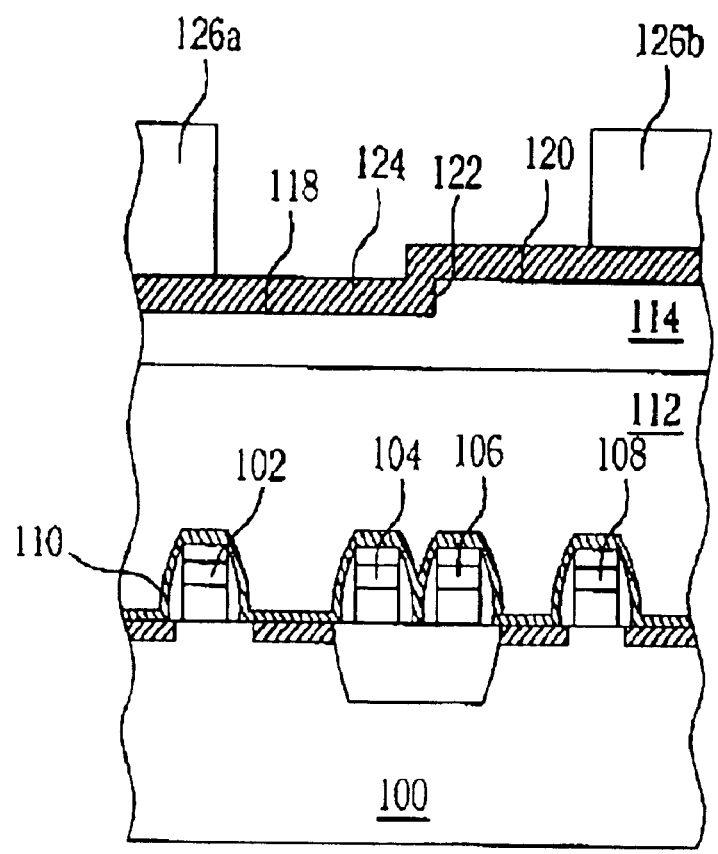
Figure 9:
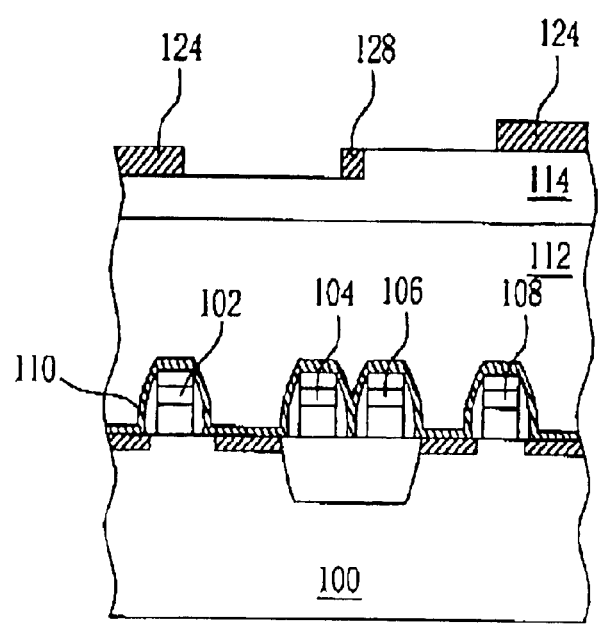

Please refer to FIG. 8. A patterned photoresist layer 126a, 126b is formed on the sacrificial layer 124. The patterned photoresist layer 126a defines a boundary of the hole 132 opposite to the hole 130. The patterned photoresist layer 126b defines a boundary of the hole 130 opposite to the hole 132. As shown in FIG. 9, an etch-back process is performed to remove the sacrificial layer 124 not covered by the patterned photoresist layer 126a and 126b so as to form a spacer 128 on the surface of the vertical surface 122. Then the patterned photoresist layer 126a and 126b is removed. In the preferable embodiment of the present invention, the etch-back process is an anisotropic etching process or a dry-etching process.

Figure 10:
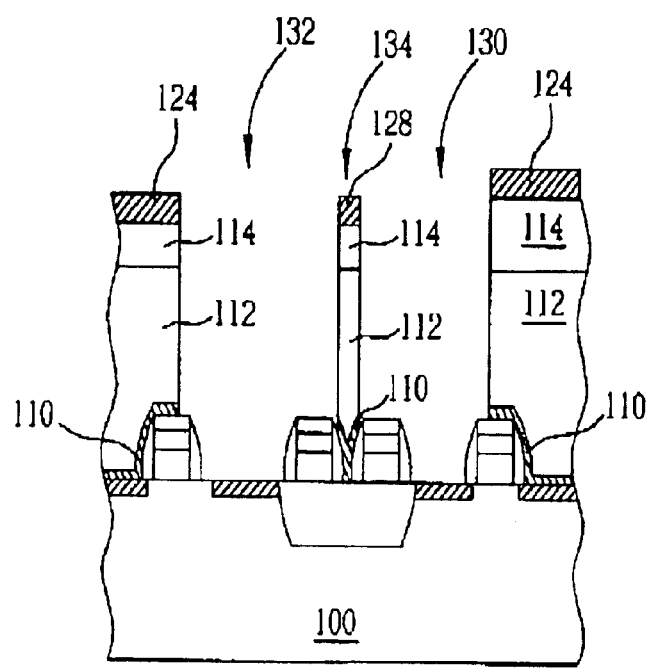

Referring to FIG. 10, the remaining sacrificial layer 124 and the spacer 128 are taken as a hard mask during an etch process to the insulating layer. As shown in FIG. 10, the USG layer 114, the BPSG layer 112, and the passivation layer 110 not covered by the hard mask are removed until the surface of the gates 102, 104, 106, 108 are exposed. Thus two adjacent holes 130 and 132 separated from a fine line structure 134 are formed. Since the spacer 128 serves as the hard mask of the fine line structure 134 during the etching process, the width of the fine line structure 134 is equal to the bottom width of the spacer 128. Therefore those skilled in the art can get an expected bottom width of the spacer 128 as a pattern of the fine line structure 134 by using a well-known skill when depositing the sacrificial layer 124 or performing the etch-back process. After the holes 130 and 132 are formed, other semiconductor elements can be formed continuously.

Figure 11:
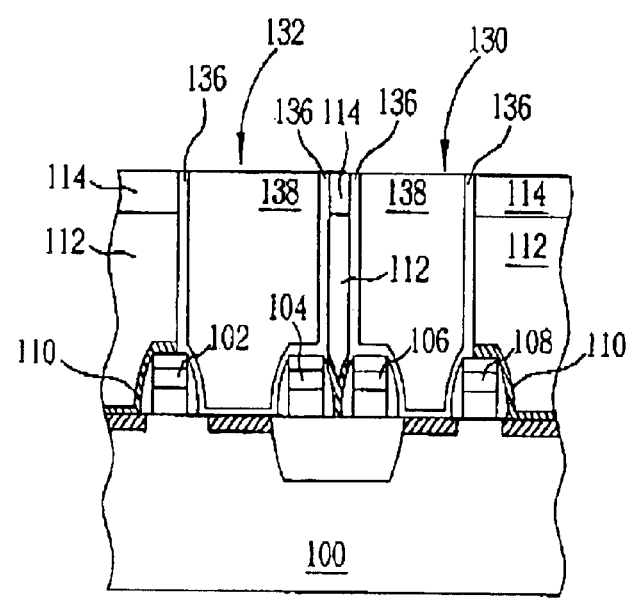
Figure 12:
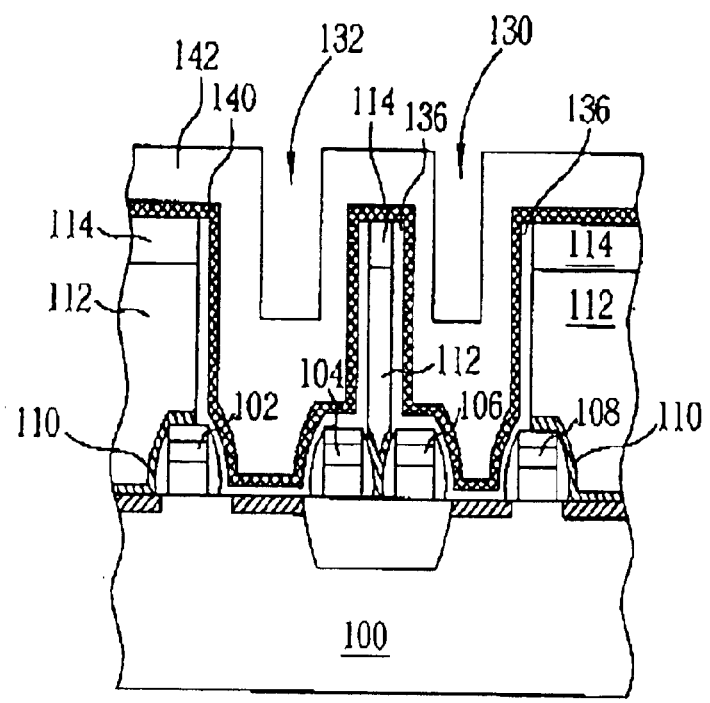

Please refer to FIGS. 11 and 12. A first doped polysilicon on layer 136 is deposited on the semiconductor substrate 100. Then a BPSG layer is filled into the holes 130 and 132 for being a support layer 138 of a following CMP process. After the CMP process is performed, portions of the remaining sacrificial layer 124, the spacer 128, the first doped polysilicon layer 136, the support layer 138, and the USG layer 114 are removed so as to gain a planar semiconductor substrate 100. As shown in FIG. 11, the support layer 138 is then removed, and a dielectric layer 140 formed by nitric oxide (NO) and a second doped polysilicon 142 are deposited on the semiconductor substrate 100. Finally, portions of the second doped polysilicon layer 142 and the dielectric layer 140 are removed by performing a PEP to form bit lines or capacitors according to the product design.

In contrast to the prior, the present invention comprises performing two photolithography processes and uses the spacer 128 as a hard mask for the etching process so as to define the two adjacent holes 130 and 132. Because the bottom width of the spacer 128 can be controlled during deposition and etching process of the sacrificial layer 124, those skilled in the art can easily gain a spacer with an expected width so as to produce the fine line structure 134 with a same width. According to the present invention, the problem of transferring the fine line structure pattern inaccurately because of light beams scattering can be prevented. Even if the width of the fine line structure 134 is smaller than 10 Å, the present invention method still can transfer the pattern of the fine line structure 134 effectively to form the adjacent holes 130 and 132. In addition, a patterned photoresist layer with high aspect ratio when a patterned photoresist layer is used to etch the insulating layer can be avoided according to the present invention method. Therefore the yield of the products can be raised.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A method of forming adjacent holes on a semiconductor substrate, wherein the adjacent holes separated by a fine line structure are a first hole and a second hole, the method comprising:

providing a semiconductor substrate with an insulating layer on the substrate:

forming a step-shaped structure on the surface of the insulating layer, the step-shaped structure comprising a first horizontal surface, a second horizontal surface, and a vertical surface between the first horizontal surface and the second horizontal;

depositing a sacrificial layer with an average thickness on the first horizontal surface, the second horizontal surface, and the vertical surface;

forming a patterned photoresist layer on portions of the first and second horizontal surface;

performing an etch-back process to remove the sacrificial layer not covered by the patterned photoresist layer and form a spacer on the vertical surface;

removing the patterned photoresist layer; and using the spacer and the remaining sacrificial layer as a hard mask to remove the insulating layer to form the two adjacent holes.

2. The method of claim 1, wherein a bottom width of the spacer is approximately equal to a width of the fine line structure.

3. The method of claim 1, wherein the width of the fine line structure is approximately smaller than the 100 angstroms (Å).

4. The method of claim 1, wherein the insulating layer comprises undoped silicate glass (USG) and borophosphosilicate glass (BPSG).

5. The method of claim 1, wherein the insulating layer comprises a first insulating layer and a second insulating layer on the first insulating layer.

6. The method of claim 5, wherein a surface layer of the first horizontal surface and the second horizontal surface is the first insulating layer.

7. The method of claim 5, wherein the first insulating layer is an USG layer, and the second insulating layer is a BPSG layer.

8. The method of claim 1, wherein a step height difference is formed between the first and second horizontal surface, and a thickness of the sacrificial layer is approximately equal to the step height difference.

9. The method of claim 1, wherein the sacrificial layer is a liner silicon nitride layer.

10. The method of claim 1, wherein the etch-back process is a dry-etching process.

11. The method of claim 1, wherein a height of the first horizontal surface is lower than a height of the second horizontal surface.

* * * * *